(12) United States Patent
Ching et al.

(10) Patent No.: US 11,121,036 B2
(45) Date of Patent: Sep. 14, 2021

(54) MULTI-GATE DEVICE AND RELATED METHODS

(71) Applicant: Taiwan Semiconductor Manufacturing Co., Ltd., Hsinchu (TW)

(72) Inventors: Kuo-Cheng Ching, Hsinchu County (TW); Huan-Chieh Su, Changhua County (TW); Shi Ning Ju, Hsinchu (TW); Guan-Lin Chen, Hsinchu County (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/573,378

(22) Filed: Sep. 17, 2019

(65) Prior Publication Data
US 2020/0119004 A1  Apr. 16, 2020

Related U.S. Application Data

(60) Provisional application No. 62/746,292, filed on Oct. 16, 2018.

(51) Int. Cl.
*H01L 21/8234* (2006.01)
*H01L 27/088* (2006.01)
(Continued)

(52) U.S. Cl.
CPC ........... *H01L 21/823431* (2013.01); *H01L 21/76224* (2013.01); *H01L 21/823412* (2013.01); *H01L 21/823418* (2013.01); *H01L 21/823481* (2013.01); *H01L 21/823821* (2013.01); *H01L 21/823878* (2013.01); *H01L 27/0886* (2013.01); *H01L 27/0924* (2013.01);
(Continued)

(58) Field of Classification Search
CPC .......... H01L 29/0669; H01L 29/66439; H01L 29/42392; H01L 29/66795; H01L 29/785; H01L 29/66545; H01L 27/0924; H01L 27/0886; H01L 21/823821; H01L 21/823431; H01L 21/823878; H01L 21/76224; H01L 21/823481; H01L 21/823418
See application file for complete search history.

(56) References Cited

U.S. PATENT DOCUMENTS 8,796,666 B1  8/2014  Huang et al.
8,815,712 B2  8/2014  Wan et al.
(Continued)

*Primary Examiner* — Joseph C. Nicely
(74) *Attorney, Agent, or Firm* — Haynes and Boone, LLP

(57) ABSTRACT

A semiconductor device includes a first transistor having a first gate structure and a first source/drain feature adjacent to the first gate structure. The semiconductor device further includes a second transistor having a second gate structure and a second source/drain feature adjacent to the second gate structure. In some examples, the semiconductor device further includes a hybrid poly layer disposed between the first transistor and the second transistor. The hybrid poly layer is adjacent to and in contact with each of the first source/drain feature and the second source/drain feature, and the hybrid poly layer provides isolation between the first transistor and the second transistor.

20 Claims, 14 Drawing Sheets

(51) Int. Cl.
   *H01L 29/66* (2006.01)
   *H01L 29/78* (2006.01)
   *H01L 21/762* (2006.01)
   *H01L 21/8238* (2006.01)
   *H01L 27/092* (2006.01)
   *H01L 29/423* (2006.01)
   *H01L 29/06* (2006.01)

(52) U.S. Cl.
   CPC .... *H01L 29/0669* (2013.01); *H01L 29/42392* (2013.01); *H01L 29/66439* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2009/0294866 A1* | 12/2009 | Eller ............... H01L 21/823864 257/369 |
| 2013/0285116 A1 | 10/2013 | Lochtefeld et al. |
| 2015/0303284 A1* | 10/2015 | Basker .............. H01L 21/31111 257/288 |
| 2020/0066867 A1* | 2/2020 | Cheng ................... H01L 29/516 |
| 2020/0303373 A1* | 9/2020 | Glass ................... H01L 29/205 |

* cited by examiner

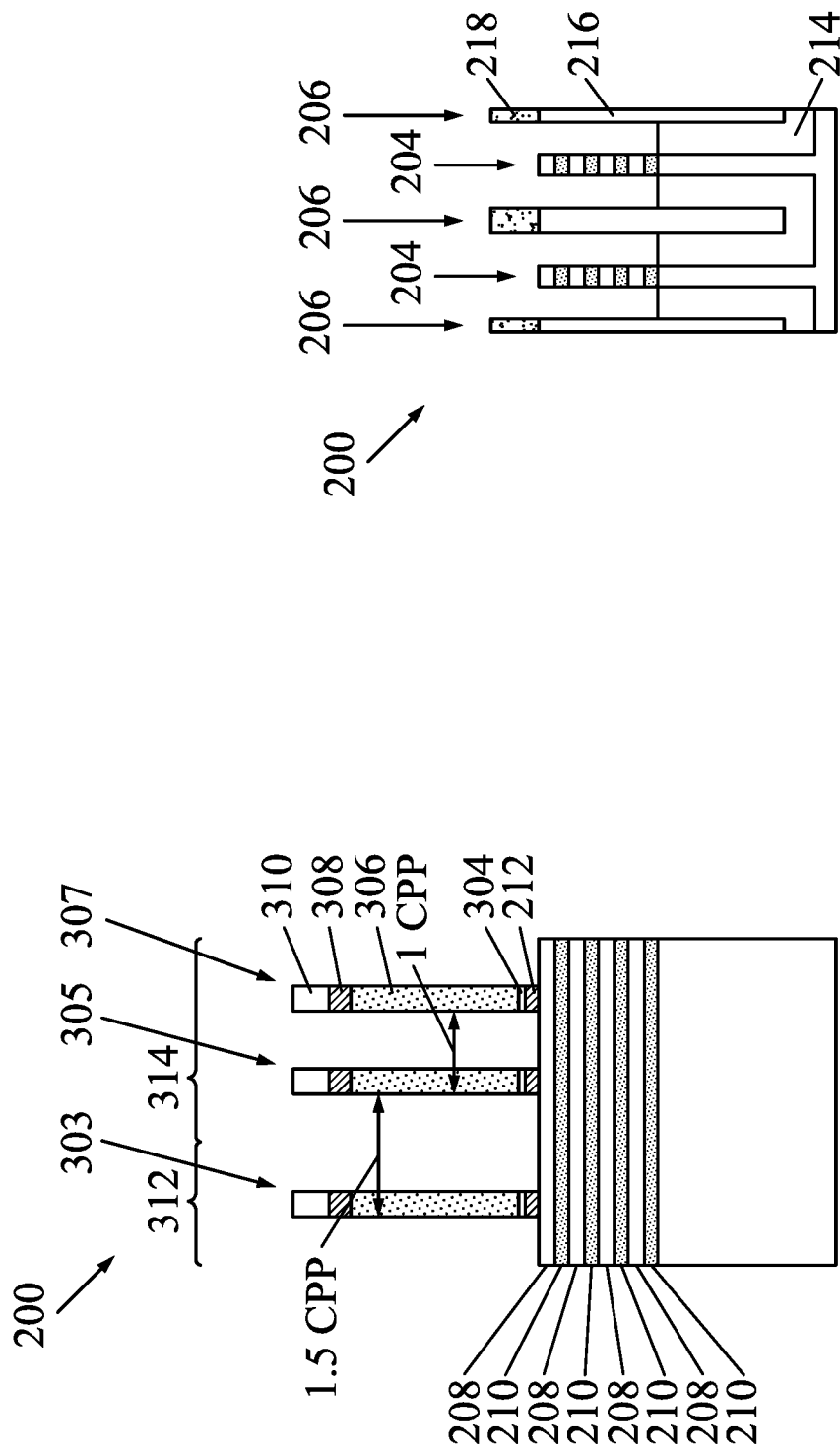

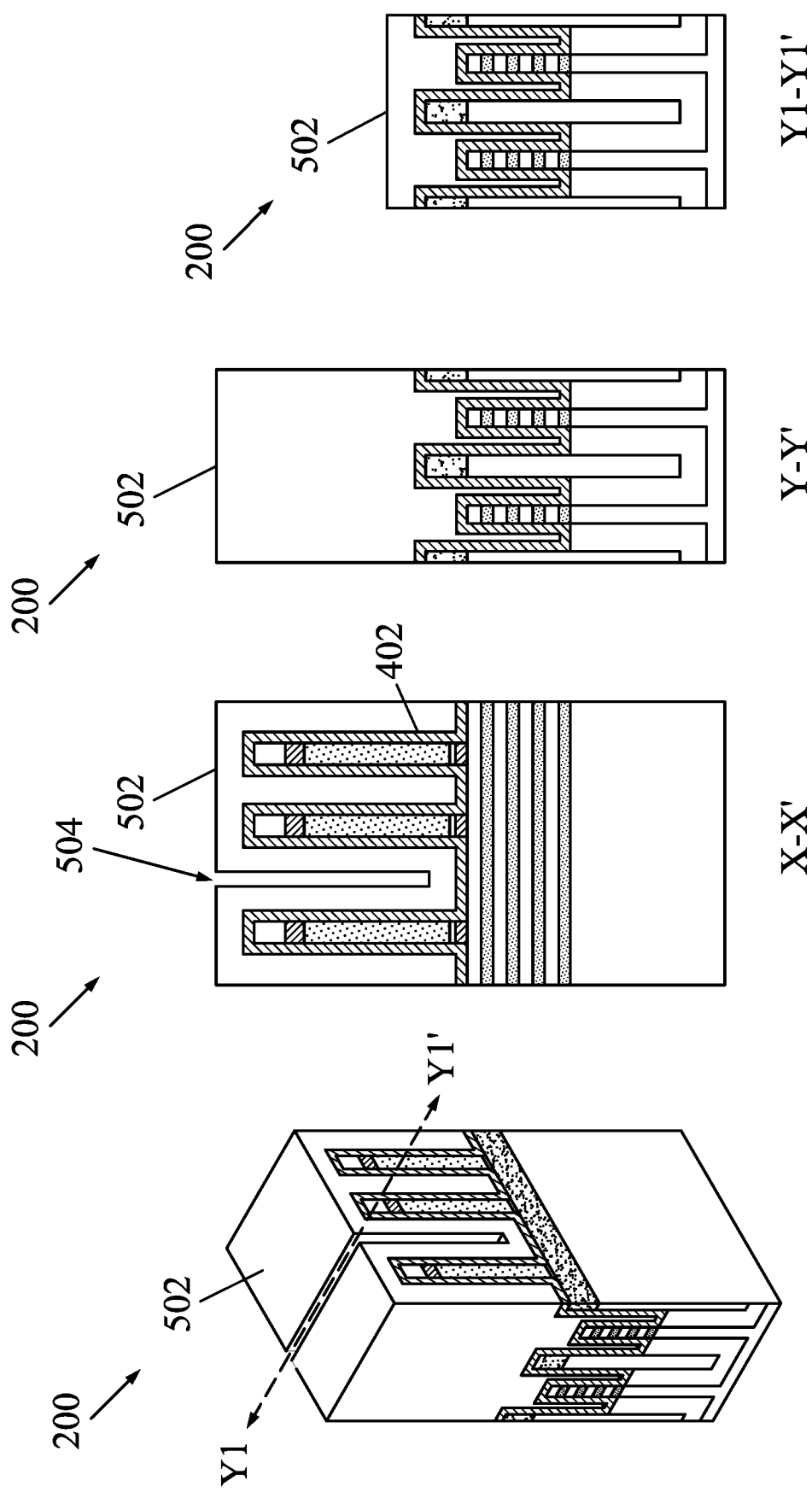

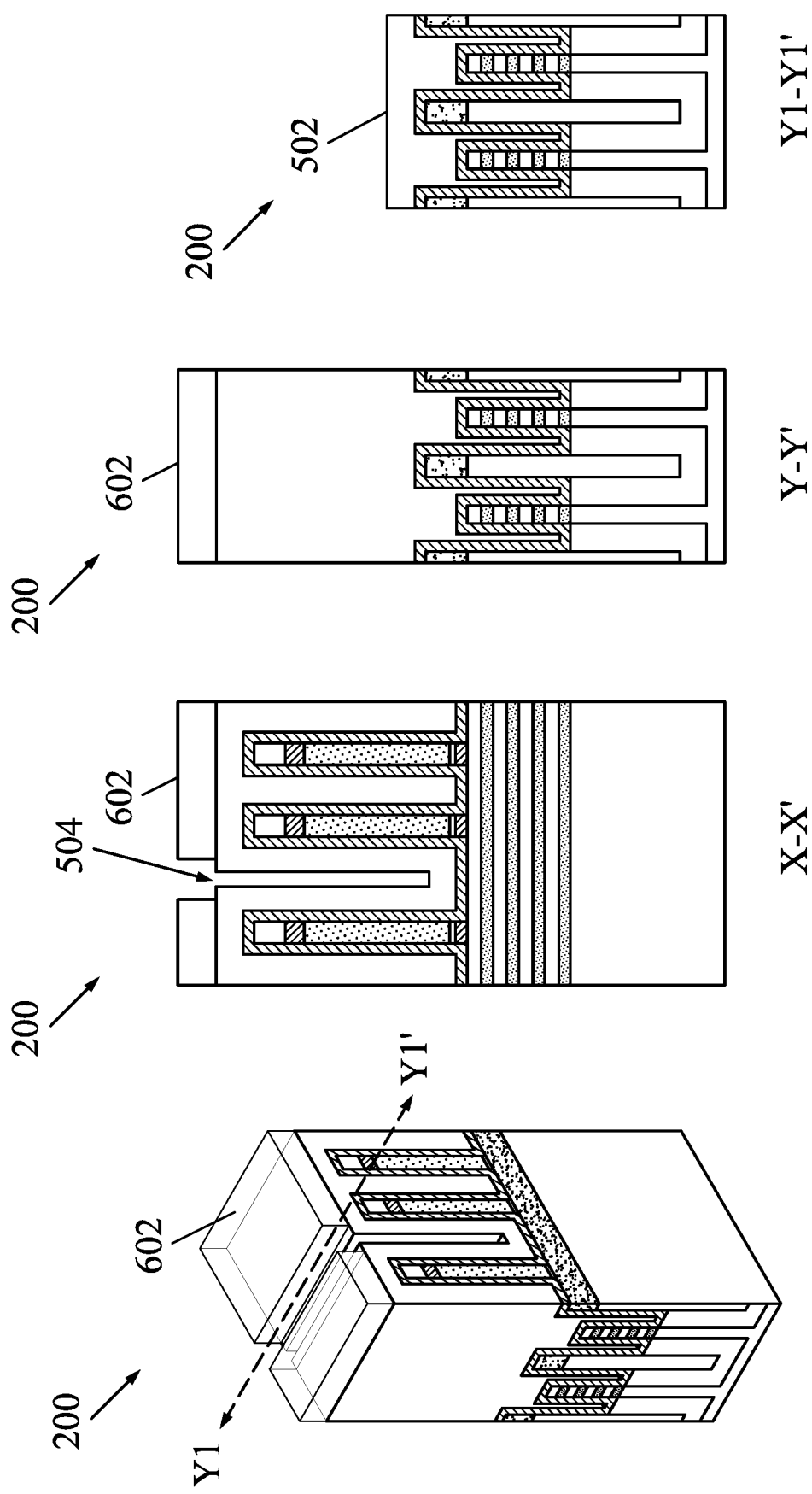

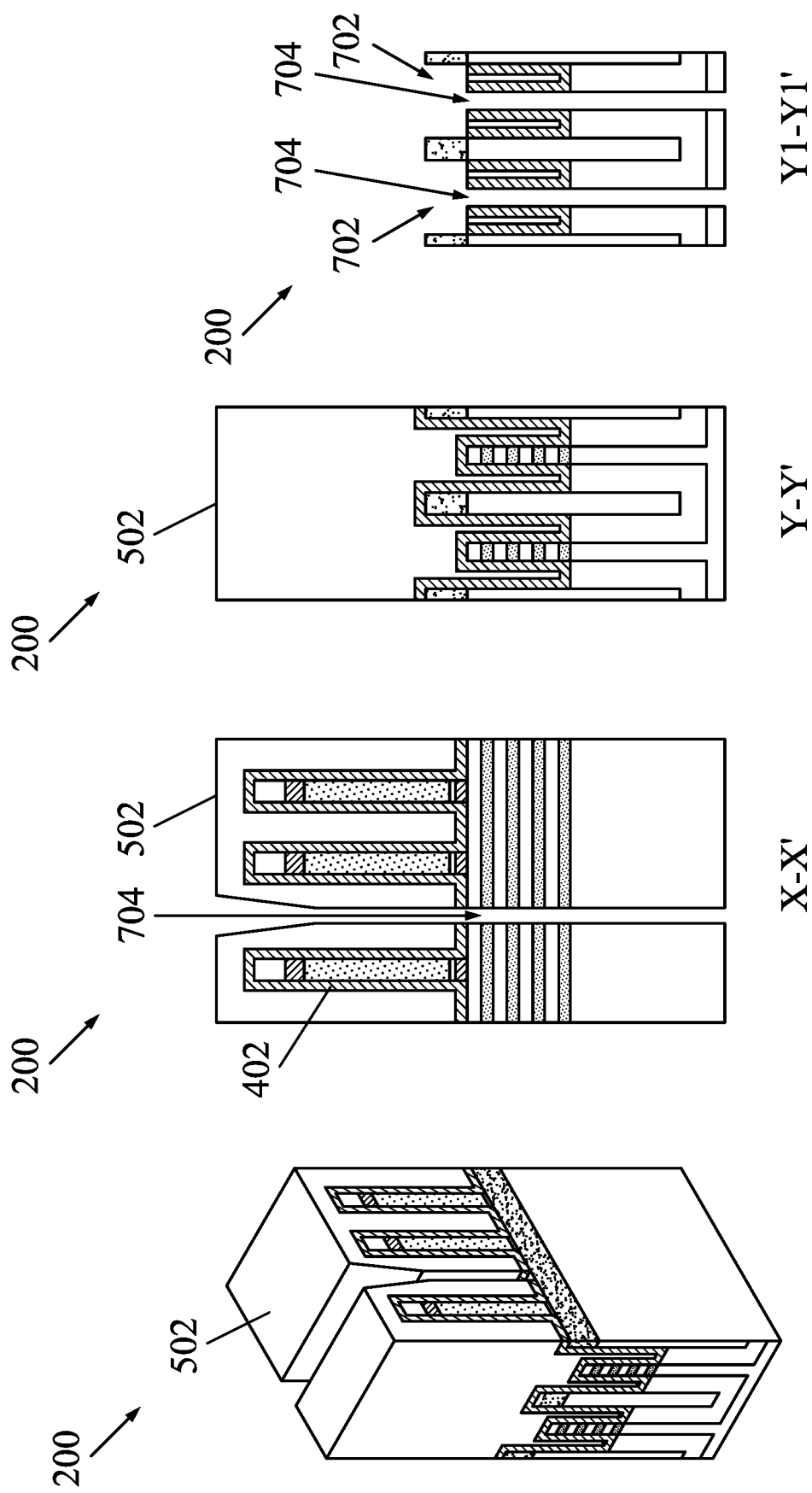

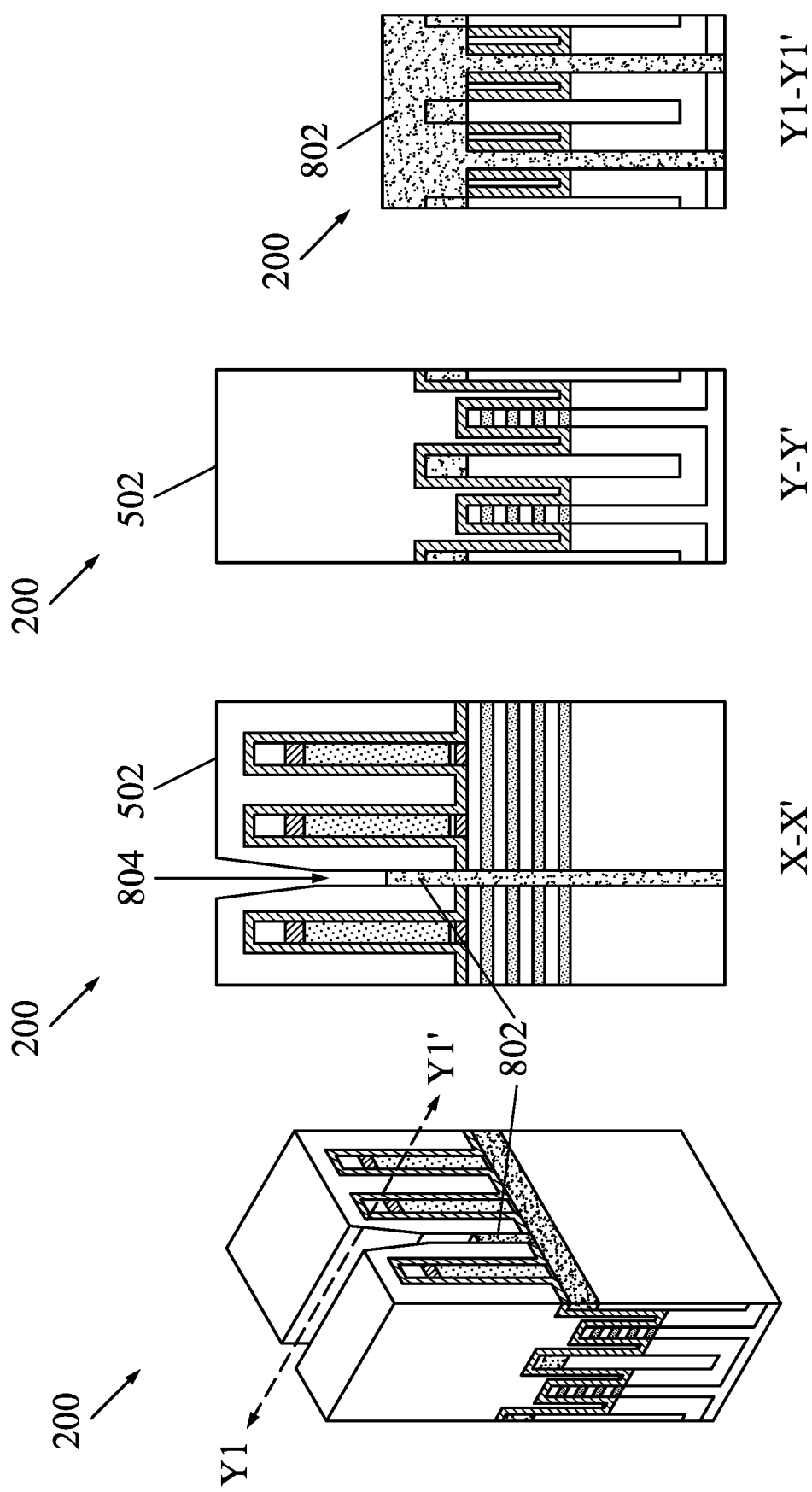

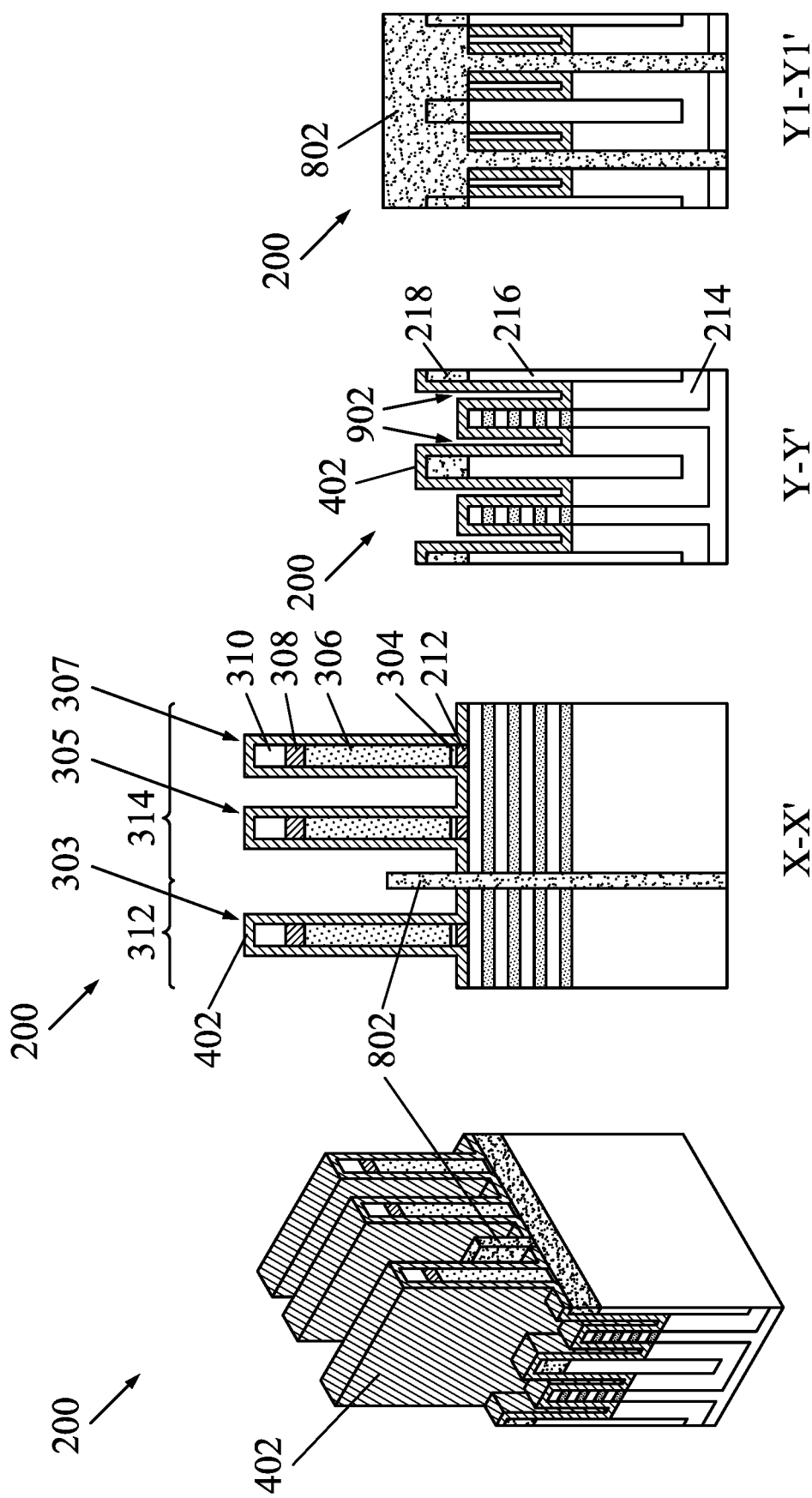

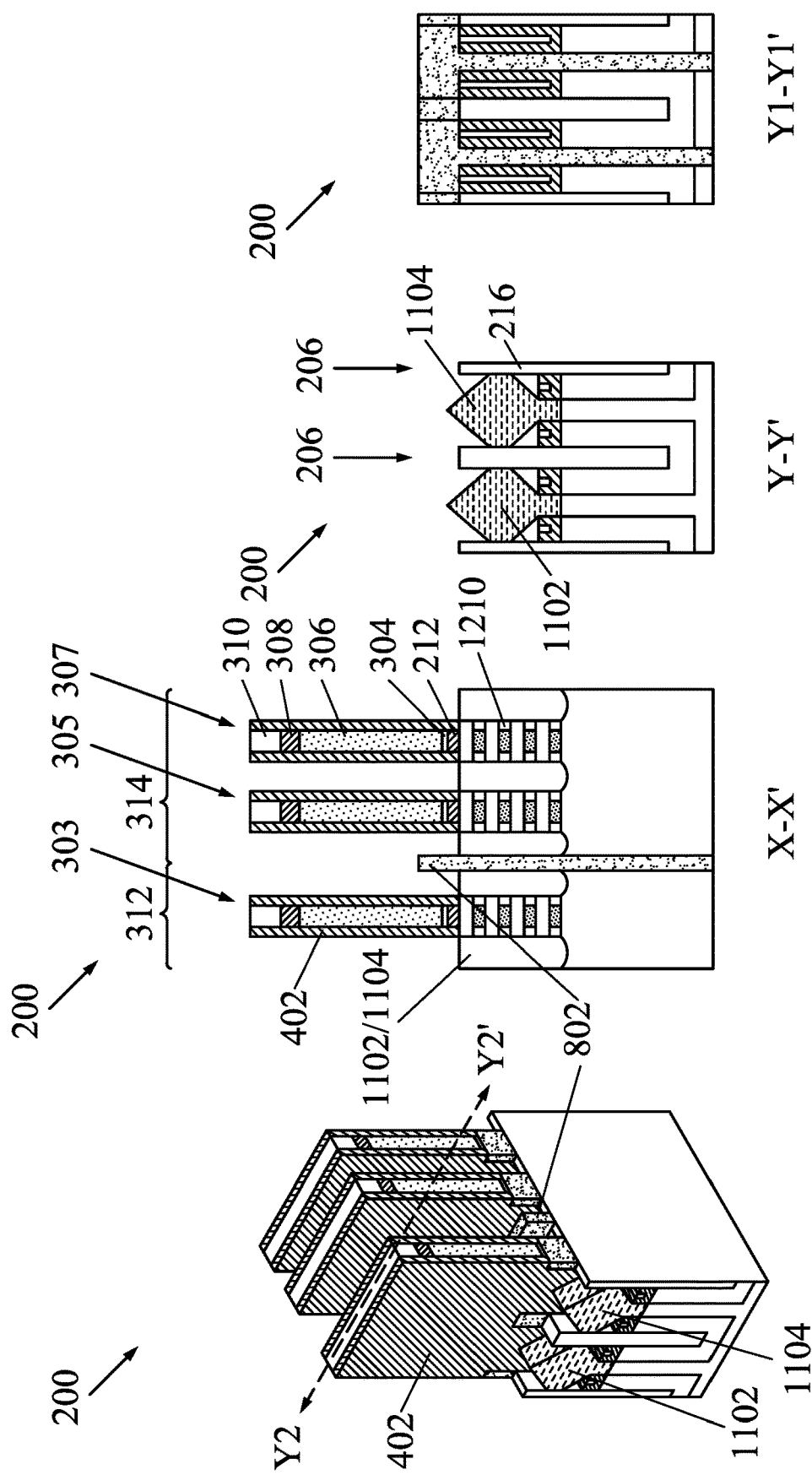

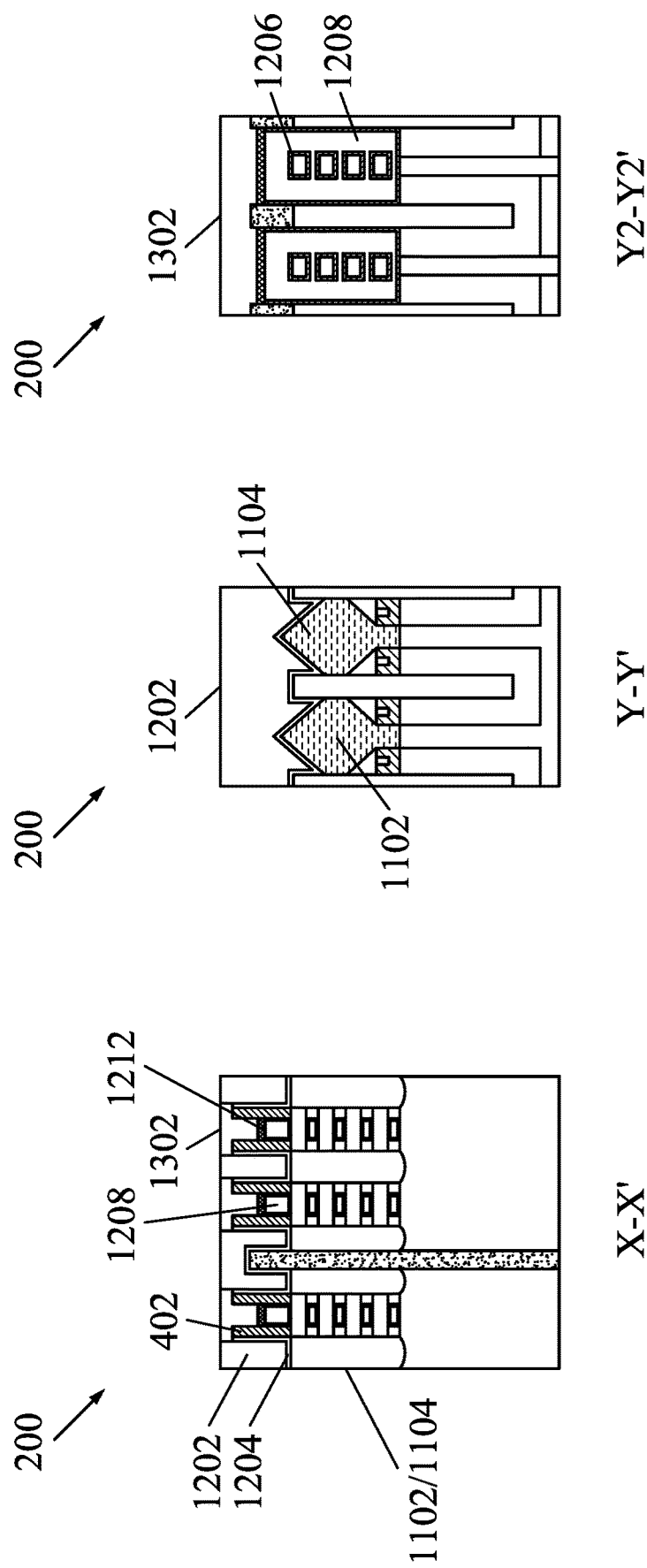
FIG. 12C  Y2-Y2'
FIG. 12B  Y-Y'
FIG. 12A  X-X'

MULTI-GATE DEVICE AND RELATED METHODS

CROSS-REFERENCE TO RELATED APPLICATION

This application claims the benefit of U.S. Provisional Application No. 62/746,292, filed Oct. 16, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFETs and GAA devices are compatible with conventional complementary metal-oxide-semiconductor (CMOS) processes and their three-dimensional structure allows them to be aggressively scaled while maintaining gate control and mitigating SCEs.

To continue to provide the desired scaling and increased density for multi-gate devices (e.g., FinFETs and GAA devices) in advanced technology nodes, continued reduction of the contacted poly pitch (CPP) (or "gate pitch") is necessary. In at least some existing implementations, various schemes such as poly on diffusion edge (PODE) and continuous poly on diffusion edge (CPODE), alternatively called single diffusion break (SDB), have been used to scale the CPP. However, such schemes cannot provide the level of device density, cell isolation, and device performance required for aggressively scaled circuits and devices. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 4A, 5A, 6A, 7A, 8A, 9A, 10A, 11A, and 13A are isometric views of an embodiment of a semiconductor device 200 according to various stages of the method of FIG. 1;

FIGS. 3B, 4B, 5B, 6B, 7B, 8B, 9B, 10B, 11B, 12A, and 13B are cross-section views, corresponding to respective isometric views listed above, of an embodiment of the semiconductor device 200 along a plane X-X', the plane X-X' being parallel to a channel of the device 200, in accordance with some embodiments;

FIGS. 3C, 4C, 5C, 6C, 7C, 8C, 9C, 10C, 11C, 12B, and 13C are cross-section views, corresponding to respective isometric views listed above, of an embodiment of the semiconductor device 200 along a plane Y-Y', the plane Y-Y' being perpendicular to the channel of the device 200 and traversing a source/drain region of the device 200, in accordance with some embodiments;

FIGS. 5D, 6D, 7D, 8D, 9D, 10D, and 11D are cross-section views, corresponding to respective isometric views listed above, of an embodiment of the semiconductor device 200 along a plane Y1-Y1', the plane Y1-Y1' being perpendicular to the channel of the device 200 and traversing an active edge of the device 200, in accordance with some embodiments;

FIGS. 12C and 13D are cross-section views, corresponding to respective isometric views listed above, of an embodiment of the semiconductor device 200 along a plane Y2-Y2', the plane Y2-Y2' being perpendicular to the channel of the device 200 and traversing the gate structure of the device 200, in accordance with some embodiments.

DETAILED DESCRIPTION

Figure 1:
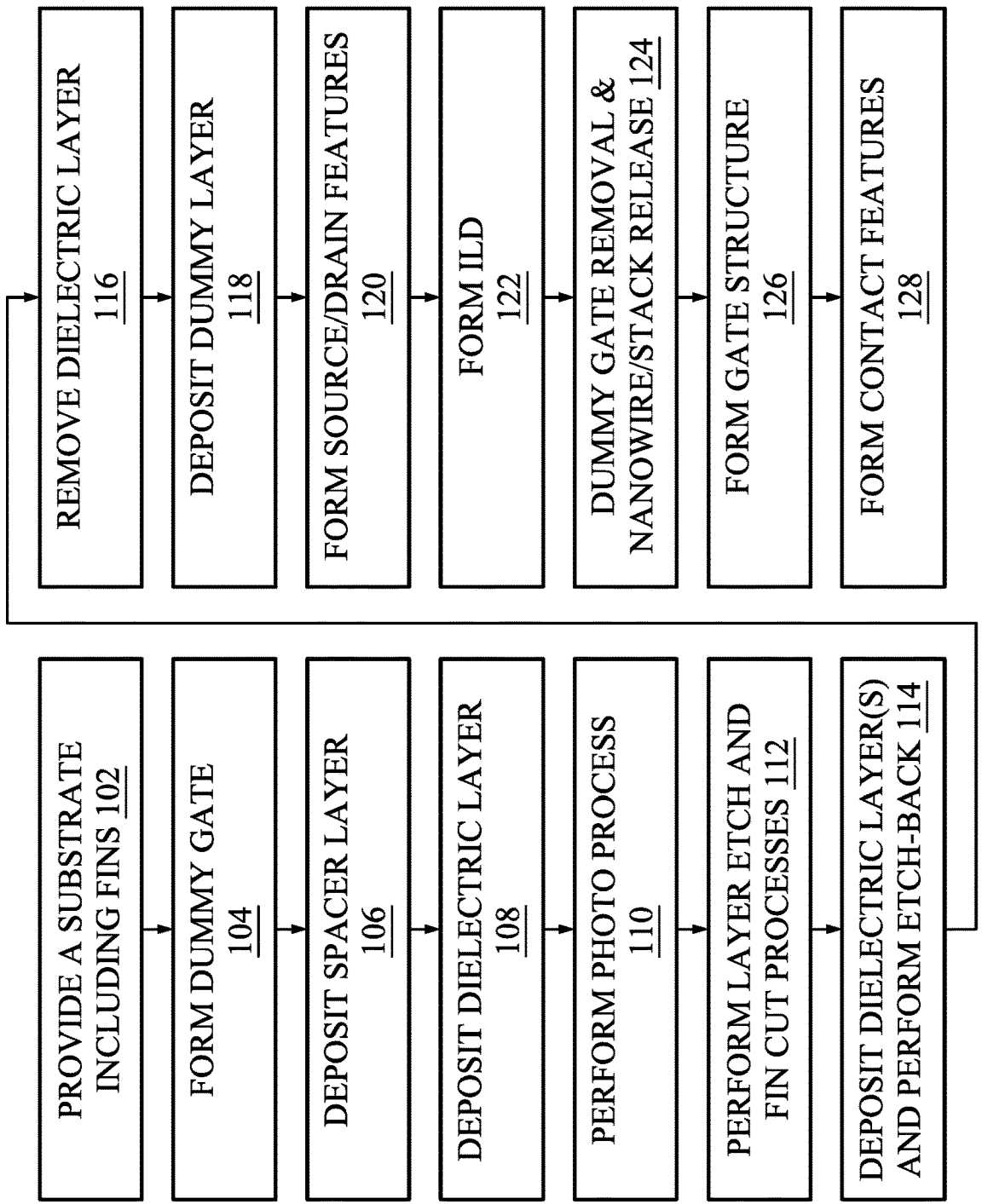
FIG. 1 is a flow chart of a method of fabricating a multi-gate device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Continuing to provide the desired scaling and increased density for multi-gate devices (e.g., FinFETs and GAA devices) in advanced technology nodes calls for scaling of the contacted poly pitch (CPP) (or "gate pitch"). In at least some existing implementations, various schemes such as poly on diffusion edge (PODE) and continuous poly on diffusion edge (CPODE) have been used to scale the CPP. For purposes of this disclosure, a "diffusion edge" may be equivalently referred to as an active edge, where for example an active edge abuts adjacent active regions. Further, an active region includes a region where transistor structures are formed (e.g., including source, drain, and gate/channel structures). In some examples, active regions may be disposed between insulating regions. The PODE scheme may provide isolation between neighboring active regions, and thus neighboring transistors, by forming a shallow trench isolation (STI) structure between the neighboring active regions. The CPODE scheme may provide such isolation by performing a cut fin process and filling the cut fin region with a dielectric, such as silicon nitride (SiN). While in at least some existing implementations, the CPODE scheme provides about a 33% reduction in CPP compared to the PODE scheme, neither of the PODE and CPODE schemes can provide the level of device density, cell isolation, and device performance required for aggressively scaled circuits and devices. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including a hybrid poly (hybrid PO) scheme for the reduction of CPP. In various embodiments, the disclosed hybrid PO scheme may provide isolation (e.g., between neighboring active regions) by performing a cut fin process and filling the cut fin region at least partially with a high-K (HK) dielectric. Generally, the hybrid PO scheme also provides for aggressive cell abutment, resulting in about a 50% reduction in CPP compared to the PODE scheme and about a 25% reduction in CPP compared to the CPODE scheme. Stated another way, the hybrid PO scheme may reduce CPP by 1.5 per cell compared to the PODE scheme and may reduce CPP by 0.5 per cell compared to the CPODE scheme. In some examples, the hybrid PO scheme may be suitable for use with GAA devices (e.g., nanosheet/nanowire devices), FinFET devices, or other types of devices. In addition, the hybrid PO scheme disclosed herein may be performed in a semiconductor process flow that includes a dual self-aligned contact (dual-SAC) process, a hybrid-SAC process, or a non-SAC process. In various examples, the hybrid PO scheme may utilize a variety of materials (e.g., to fill the cut fin region) such as (i) a high-K (HK) material including $HfO_2$, $ZrO_2$, $HfAlO_x$, $HfSiO_x$, $Al_2O_3$, or another high-K material (e.g., with a dielectric constant 'k'>7); (ii) a low-K (LK) material including SiCN, SiOC, SiOCN, or another low-K material (e.g., with a dielectric constant 'k'<7), or (iii) a bi-layer dielectric material (e.g., where the upper part is HK, and the lower part is LK). In some embodiments, a hybrid poly height (e.g., above a top surface of an adjacent fin structure) may be between about 10-30 nm, a hybrid poly critical dimension (CD) may be about 6 nm, a hybrid poly depth (e.g., below the top surface of the adjacent fin structure) may be between about 90-200 nm, a hybrid PO HK/LK ratio (e.g., for embodiments including a bi-layer dielectric) may be between about 1/20-20/1, and a depth of LK and HK may be between about 0-200 nm. By employing the disclosed hybrid PO scheme, device density may be increased, cell isolation is improved, and device performance is enhanced. Other embodiments and advantages will be evident to those skilled in the art upon reading the present disclosure.

Illustrated in FIG. 1 is a method 100 of semiconductor fabrication including fabrication of multi-gate devices using a hybrid PO scheme, in accordance with various embodiments. As discussed above, multi-gate devices may include FinFETs, GAA devices, or other devices having gate structures formed on at least two-sides of a channel region and may include devices having channel regions formed as nanosheet channel(s), nanowire channel(s), bar-shaped channel(s), and/or other suitable channel configurations. The method 100 is discussed below with reference to a GAA device having a channel region that may be referred to as a nanowire and/or nanosheet and which may include various geometries (e.g., cylindrical, bar-shaped) and dimensions. However, it will be understood that aspects of the method 100, including the disclosed hybrid PO scheme, may be equally applied to other types of multi-gate devices (e.g., such as FinFETs or devices including both GAA devices and FinFETs) without departing from the scope of the present disclosure. It is understood that the method 100 includes steps having features of a complementary metal-oxide-semiconductor (CMOS) technology process flow and thus, are only described briefly herein. Also, additional steps may be performed before, after, and/or during the method 100.

FIGS. 2, 3A, 4A, 5A, 6A, 7A, 8A, 9A, 10A, 11A, and 13A are isometric views of an embodiment of a semiconductor device 200 according to various stages of the method 100 of FIG. 1. FIGS. 3B, 4B, 5B, 6B, 7B, 8B, 9B, 10B, 11B, 12A, and 13B are cross-section views, corresponding to respective isometric views listed above, of an embodiment of the semiconductor device 200 along a plane X-X', the plane X-X' being parallel to a channel of the device 200. FIGS. 3C, 4C, 5C, 6C, 7C, 8C, 9C, 10C, 11C, 12B, and 13C are cross-section views, corresponding to respective isometric views listed above, of an embodiment of the semiconductor device 200 along a plane Y-Y', the plane Y-Y' being perpendicular to the channel of the device 200 and traversing a source/drain region of the device 200. FIGS. 5D, 6D, 7D, 8D, 9D, 10D, and 11D are cross-section views, corresponding to respective isometric views listed above, of an embodiment of the semiconductor device 200 along a plane Y1-Y1', the plane Y1-Y1' being perpendicular to the channel of the device 200 and traversing an active edge of the device 200. FIGS. 12C and 13D are cross-section views, corresponding to respective isometric views listed above, of an embodiment of the semiconductor device 200 along a plane Y2-Y2', the plane Y2-Y2' being perpendicular to the channel of the device 200 and traversing the gate structure of the device 200.

Further, the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow.

The method 100 begins at block 102 where a substrate including fins is provided. Referring to the example of FIG. 2, in an embodiment of block 102, a substrate 202 including fins 204 and hybrid fins 206 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

The fins 204, which include layers 208 and 210, may be formed prior to the hybrid fins 206. In some embodiments, the fins 204 are formed by growing epitaxial layers of a first composition (e.g., which are subsequently patterned to form the layers 210) interposed by epitaxial layers of a second composition (e.g., which are subsequently patterned to form the layers 208). In an embodiment, the epitaxial layers of the first composition (e.g., used to form layers 210) are SiGe and the epitaxial layers of the second composition (e.g., used to form layers 208) are silicon (Si). However, other embodiments are possible including those that provide for a first composition and a second composition having different oxidation rates and/or etch selectivity. For example, in some embodiments, either of the epitaxial layers of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the epitaxial layers of the first composition or the second composition may be performed by a molecular beam epitaxy (MBE) process, a metalorganic chemical vapor deposition (MOCVD) process, and/or other suitable epitaxial growth processes. It is also noted that while the layers 208, 210 are shown as having a particular stacking sequence within the fins 204, where the layer 208 is the topmost layer of the stack of layers 208, 210, other configurations are possible. For example, in some cases, the layer 210 may alternatively be the topmost layer of the stack of layers 208, 210. Stated another way, the order of growth for the layers 208, 210, and thus their stacking sequence, may be switched or otherwise be different than what is shown in the figures, while remaining within the scope of the present disclosure.

After forming the epitaxial layers of the first composition (e.g., used to form the layers 210) and the epitaxial layers of the second composition (e.g., used to form the layers 208), a hard mask (HM) layer (e.g. which is subsequently patterned to form a HM layer 212) may be formed over the device 200. In some embodiments, the HM layer includes an oxide layer (e.g., a pad oxide layer that may include $SiO_2$) and nitride layer (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. Generally, in some embodiments, the HM layer may include a nitride-containing material deposited by CVD, ALD, PVD, or other suitable process.

After forming the HM layer, the fins 204 extending from the substrate 202 are formed. The fins 204 may be fabricated using suitable processes including photolithography and etch processes. The photolithography process may include forming a photoresist layer over the device 200, exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 202, and layers formed thereupon, while an etch process forms trenches in unprotected regions through the HM layer, through the epitaxial layers of the first composition and the second composition, and into the substrate 202, thereby leaving the plurality of extending fins 204. The trenches may be etched using a dry etch (e.g., reactive ion etching), a wet etch, and/or other suitable processes.

In various embodiments, each of the fins 204 includes a substrate portion formed from the substrate 202, the layers 210 (e.g., including the first composition), the layers 208 (e.g., including the second composition), and the HM layer 212. In some embodiments, the HM layer 212 may be removed (e.g., by a CMP process) prior to formation of the fins 204. In some examples, the HM layer 212 is used to mitigate loss of material of the fins 204 during a subsequent gate etch process. In various embodiments, the epitaxial layers 208 (e.g., including the second composition), or portions thereof, may form a channel region of a GAA transistor of the device 200. For example, the layers 208 may be referred to as nanosheets or nanowires that are used to form a channel region of a GAA device. These nanosheets or nanowires are also used to form portions of the source/drain features of the GAA device, as discussed below. In embodiments where a FinFET is formed, each of the fins 204 may alternatively include an epitaxial layer of a uniform composition formed over the substrate portion, or each of the fins 204 may include a portion of the patterned substrate without an additional epitaxial layer formed over the substrate portion.

It is noted that while the fins 204 are illustrated as including four (4) layers of the epitaxial layer 210 and four (4) layers of the epitaxial layer 208, this is for illustrative purposes only and not intended to be limiting beyond what is specifically recited in the claims. It can be appreciated that any number of epitaxial layers can be formed, where for example, the number of epitaxial layers depends on the desired number of channels regions for the GAA device. In some embodiments, the number of epitaxial layers 208 is between 4 and 10.

In some embodiments, the epitaxial layer 210 has a thickness range of about 4-8 nanometers (nm). In some cases, the epitaxial layer 208 has a thickness range of about 5-8 nm. As noted above, the epitaxial layers 208 may serve as channel region(s) for a subsequently-formed multi-gate device (e.g., a GAA device) and its thickness may be chosen based on device performance considerations. The epitaxial layers 210 may serve to define a gap distance between adjacent channel region(s) for the subsequently-formed multi-gate device and its thickness may also be chosen based on device performance considerations.

After forming the fins 204, the trenches interposing the fins 204 may be filled with a dielectric material to form shallow trench isolation (STI) features interposing the fins 204, where the STI features are subsequently recessed to form the STI features 214. In some embodiments, the dielectric layer used to fill the trenches may include $SiO_2$, silicon nitride, silicon oxynitride, fluorine-doped silicate glass (FSG), a low-k dielectric, combinations thereof, and/or other suitable materials known in the art. In various examples, the dielectric layer may be deposited by a CVD process, a subatmospheric CVD (SACVD) process, a flowable CVD process, an ALD process, a PVD process, and/or other suitable process.

In some embodiments, the STI features interposing the fins 204 may be patterned (e.g., using a photolithography and etching process) to form trenches within the STI features and within which the hybrid fins 206 will be formed. Alternatively, the dielectric material used to form the STI features may be deposited conformally over the fins 204, such that the conformal deposition itself forms trenches within the STI features and between adjacent fins 204. Regardless of how they are formed, the trenches within the STI features may be filled with a first material 216 and a second material 218 disposed over the first material 216, thereby forming the hybrid fins 206. In some embodiments, the first material 216 may include a low-K (LK) material including SiCN, SiOC, SiOCN, or another low-K material (e.g., with a dielectric constant 'k'<7). In some examples the second material 218 may include a high-K (HK) material including $HfO2$, $ZrO2$, $HfAlOx$, $HfSiOx$, $Al2O3$, or another high-K material (e.g., with a dielectric constant 'k'>7). Thus, in various cases, the hybrid fins 206 may include a bi-layer dielectric material, where an upper portion (e.g., the second material 218) is HK and where a lower portion (e.g., the first material 216) is LK. In some examples, a ratio of the upper portion to the lower portion, that is a HK/LK ratio, is about 1/20-20/1. In some embodiments, hybrid fins 206 may effectively prevent the undesirable lateral merging of the source/drain epi-layers formed on adjacent fins 204, as discussed in more detail below.

Figure 2:
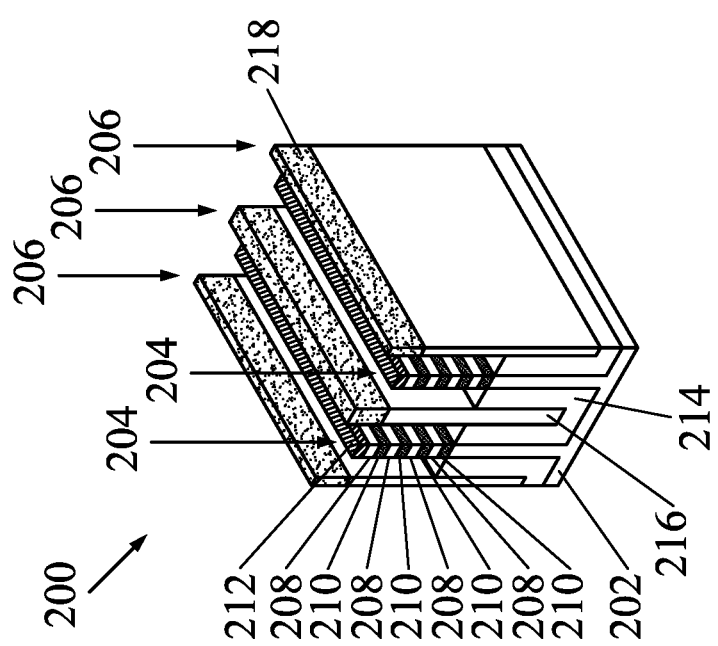

In various embodiments, after deposition of the first material 216 and the second material 218 to form the hybrid fins 206, the STI features may be recessed to form the STI features 214. As shown in the example of FIG. 2, the STI features 214 are recessed such that the fins 204 and the hybrid fins 206 extend above the STI features 214. In some embodiments, the recessing process may include a dry etching process, a wet etching process, and/or a combination thereof. In some embodiments, a recessing depth is controlled (e.g., by controlling an etching time) to result in a desired height 'H' of the exposed upper portion of the fins 204 and the hybrid fins 206. In some embodiments, the height 'H' exposes each of the epitaxial layers 210 and 208 of the fins 204.

The method 100 then proceeds to block 104 where a dummy gate structure is formed. While the present discussion is directed to a replacement gate (gate-last) process whereby a dummy gate structure is formed and subsequently replaced, other configurations may be possible.

Figure 3A:
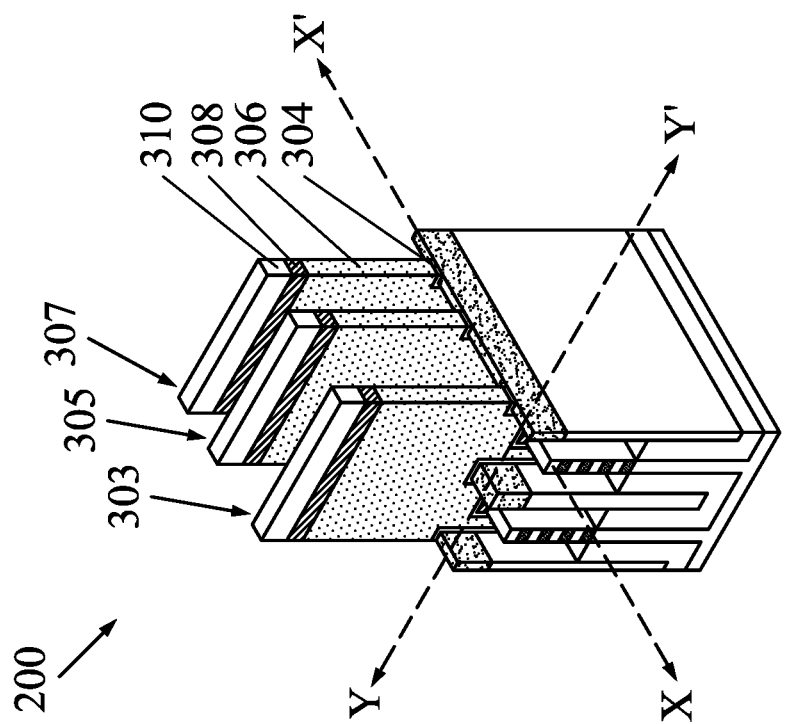

With reference to FIGS. 3A, 3B, and 3C, in an embodiment of block 104, gate stacks 303, 305, 307 are formed over the fins 204 and over the hybrid fins 206. In an embodiment, the gate stacks 303, 305, 307 are dummy (sacrificial) gate stacks that are subsequently removed and replaced by the final gate stack at a subsequent processing stage of the device 200, as discussed below. The gate stacks 303, 305, 307 may be replaced at a later processing stage by a high-K dielectric layer (HK) and metal gate electrode (MG). In some embodiments, the gate stacks 303, 305, 307 are formed over the substrate 202 and are at least partially disposed over the fins 204 and the hybrid fins 206. The portion of the fins 204 underlying the gate stacks 303, 305, 307 may be referred to as the channel region. The gate stacks 303, 305, 307 may also define a source/drain region of the fins 204, for example, the regions of the fins 204 adjacent to and on opposing sides of the channel region.

In some embodiments, the gate stacks 303, 305, 307 include a dielectric layer 304 and an electrode layer 306. The gate stacks 303, 305, 307 may also include one or more hard mask layers 308, 310. In some embodiments, the hard mask layer 308 may include an oxide layer, and the hard mask layer 310 may include a nitride layer. In some embodiments, the gate stacks 303, 305, 307 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In forming the gate stacks 303, 305, 307 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. By way of example, the etching process used to form the gate stacks 303, 305, 307 may also etch portions of the HM layer 212 adjacent to and on either side of the gate stacks 303, 305, 307, stopping on the topmost epitaxial layer 208.

In some embodiments, the dielectric layer 304 includes silicon oxide. Alternatively, or additionally, the dielectric layer 304 may include silicon nitride, a high-K dielectric material or other suitable material. In some embodiments, the electrode layer 306 may include polycrystalline silicon (polysilicon). In some embodiments, the oxide of the hard mask layer 308 includes a pad oxide layer that may include SiO$_2$. In some embodiments, the nitride of the hard mask layer 310 includes a pad nitride layer that may include Si$_3$N$_4$, silicon oxynitride or silicon carbide.

With reference to FIG. 3B, region 312 may include a first active region, and region 314 may include a second active region, where an active edge is defined at a boundary of the regions 312 and 314. The active regions 312, 314 include regions where transistor structures are formed (e.g., including source, drain, and gate/channel structures). As previously noted, active regions may be disposed between, and thus electrically isolated from one another by, insulating regions. Embodiments of the disclosed hybrid PO scheme may provide isolation between neighboring active regions 312, 314 by performing a cut fin process (e.g., at the boundary between the regions 312 and 314) and filling the cut fin region at least partially with a high-K (HK) dielectric, as described in more detail below. In various embodiments, the hybrid PO scheme provides for aggressive cell abutment (e.g., aggressive abutment of adjacent active regions 312, 314), resulting in about a 25% reduction in CPP compared to the CPODE scheme. In some examples, the hybrid PO scheme may provide a 1.5 CPP between adjacent gate stacks 303 and 305 separated by the active edge, and the hybrid PO scheme may provide a 1 CPP between adjacent gate stacks 305 and 307 within the same active region 314.

Figures 4A, 4B, 4C:
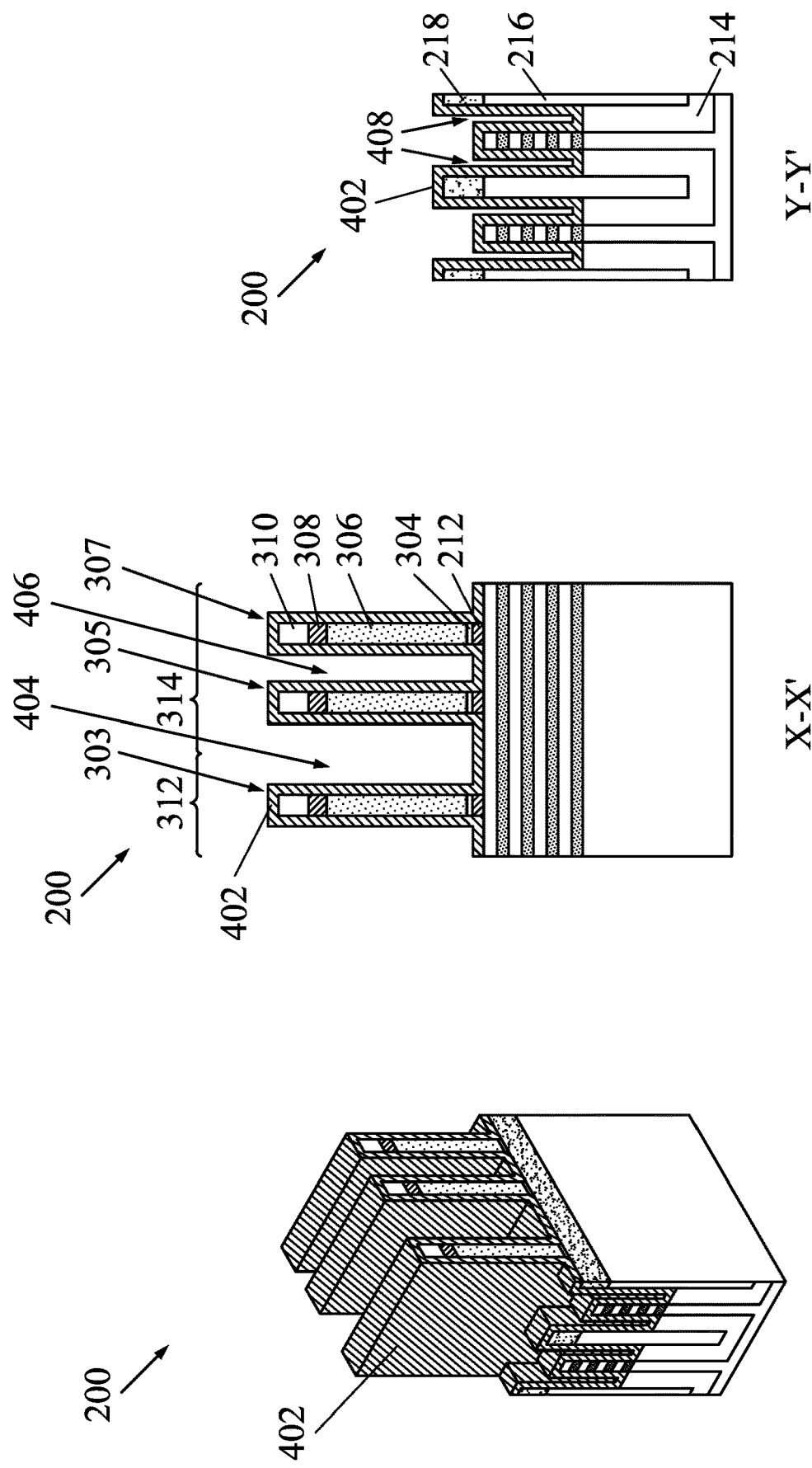
Figures 10A, 10B, 10C, 10D:
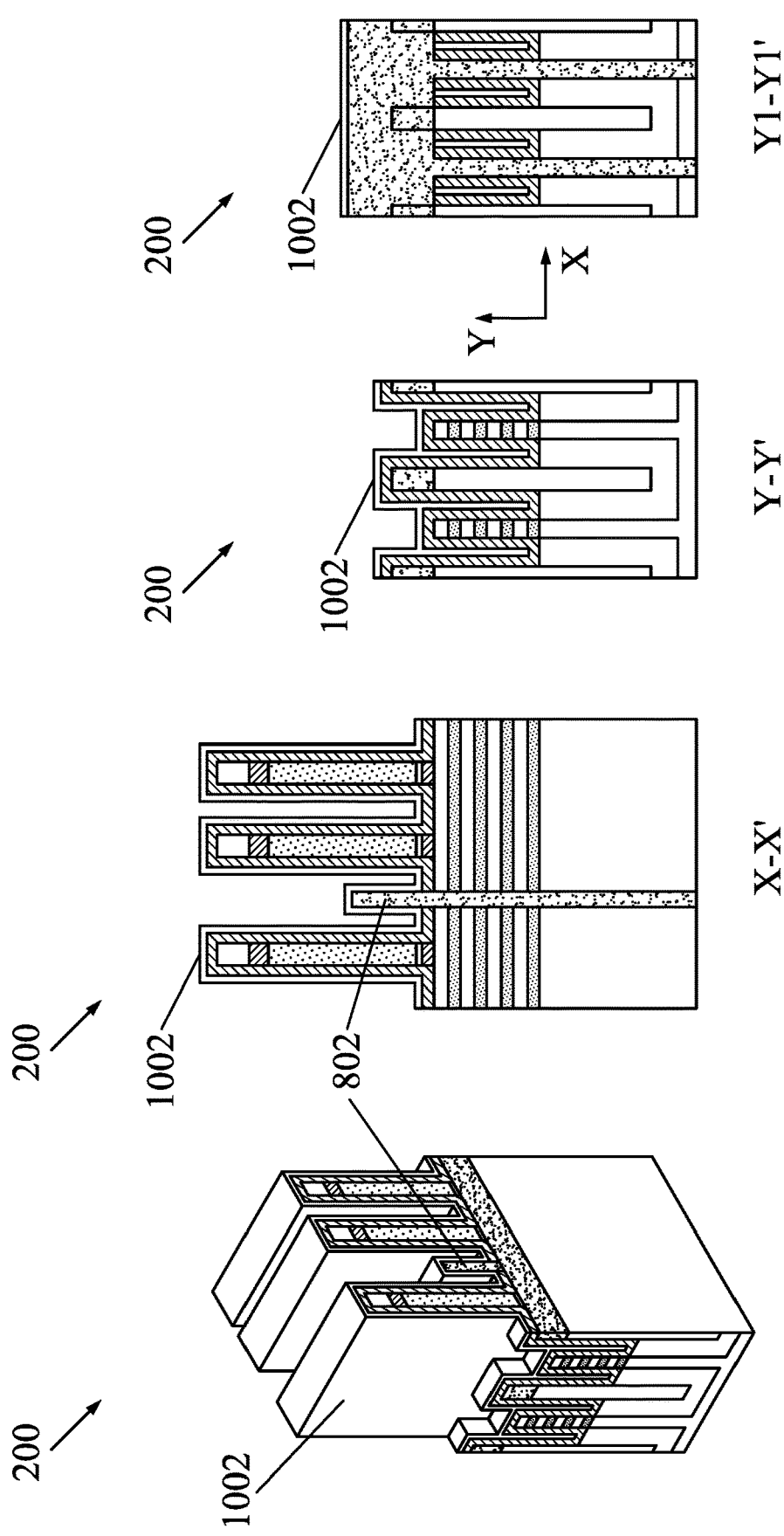

The method 100 then proceeds to block 106 where a spacer material layer is deposited on the substrate. The spacer material layer may be a conformal layer. With reference to FIGS. 4A, 4B, and 4C, in an embodiment of block 106, a spacer layer 402 is conformally deposited over the device 200, including over and on sidewalls of the gate stacks 303, 305, 307, and over and on sidewalls of exposed portions of the fins 204 and the hybrid fins 206 (e.g., portions of the fins 204 and the hybrid fins 206 not covered by the gate stacks 303, 305, 307). The spacer layer 402 may have a thickness of about 2-10 nm. In some examples, the spacer layer 402 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the spacer layer 402 includes multiple layers, such as main spacer layers, liner layers, and the like. By way of example, the spacer layer 402 may be formed by conformally depositing a dielectric material over the device 200 using processes such as a CVD process, a subatmospheric CVD (SACVD) process, a flowable CVD process, an ALD process, a PVD process, or other suitable process. Further, in various embodiments, the conformal deposition of the spacer layer 402 results in a trench 404 between adjacent gate stacks 303 and 305 separated by the active edge, and a trench 406 between adjacent gate stacks 305 and 307 within the same active region 314. In some embodiments, the conformal deposition of the spacer layer 402 may further result in trenches 408 between adjacent fins 204 and hybrid fins 206.

The method 100 then proceeds to block 108 where a dielectric layer is deposited on the substrate. The dielectric layer may be a conformal layer. With reference to FIGS. 5A, 5B, 5C, and 5D, in an embodiment of block 108, a dielectric layer 502 is conformally deposited over the device 200, including over the previously deposited spacer layer 402. The dielectric layer 502 may have a thickness of about 3-15 nm. In some examples, the dielectric layer 502 may include a silicon nitride layer. By way of example, the dielectric layer 502 may be formed by conformally depositing the dielectric layer 502 over the device 200 using processes such as a CVD process, a subatmospheric CVD (SACVD) process, a flowable CVD process, an ALD process, a PVD process, or other suitable process. In some embodiments, and due to the larger spacing between adjacent gate stacks 303 and 305, as compared to the spacing between adjacent gate stacks 305 and 307, the conformal deposition of the dielectric layer 502 may result in a trench 504 between adjacent gate stacks 303 and 305 separated by the active edge. In contrast, the conformal deposition of the dielectric layer 502 may entirely fill the trench 406 between adjacent gate stacks 305 and 307, as well as the trenches 408 between adjacent fins 204 and hybrid fins 206. It is noted that FIG. 5D illustrates a cross-section view of the device 200 along a plane substantially parallel to the plane Y1-Y1' (FIG. 5A), which is the plane that includes the active edge (e.g., at the boundary between the active regions 312 and 314) and the trench 504. In some alternative embodiments, the dielectric layer 502 may be deposited over the device 200 such that all the trenches 404, 406, 408 are filled, after which a photolithography and etching process may be performed to form the trench 504 within the dielectric layer 502.

The method 100 then proceeds to block 110 where a photolithography process is performed. With reference to FIGS. 6A, 6B, 6C, and 6D, in an embodiment of block 110, a photolithography process is performed to provide a patterned resist layer 602. The photolithography process of block 110 may include forming a photoresist layer over the device 200, exposing the resist to a pattern, performing post-exposure bake processes, and developing the resist to form the patterned resist layer 602. In some embodiments, patterning the resist to form the patterned resist layer 602 may be performed using an electron beam (e-beam) lithography process. The patterned resist layer 602 may then be used to protect regions of the device 200, and layers formed thereupon, during a subsequent etch and fin cut process, as described below.

The method 100 then proceeds to block 112 where layer etch and fin cut processes are performed. With reference to FIGS. 7A, 7B, 7C, and 7D, in an embodiment of block 112, layer etch and fin cut processes are performed, for example, using the patterned resist layer 602 as a masking layer. The etch process of block 112 may etch the dielectric layer 502 and the spacer layer 402 from over top surfaces of the fins 204 and hybrid fins 206 within the trench 504 that remains exposed by an opening of the patterned resist layer 602. The etch process may include a dry etch (e.g., reactive ion etching), a wet etch, or a combination thereof. The etch process thus exposes top surfaces of the fins 204 and the hybrid fins 206 along the plane substantially parallel to the plane Y1-Y1', which is the plane that includes the active edge (e.g., at the boundary between the active regions 312 and 314). After exposing the top surfaces of the fins 204 and the hybrid fins 206, and in a further embodiment of block 112, a fin cut process is performed. In particular, the fin cut process may be performed to etch, cut, or otherwise remove portions of the fins 204 along the plane substantially parallel to the plane Y1-Y1', as shown in FIG. 7D. Thus, the fin cut process may be used to remove portions of the epitaxial layers 208 and 210, the substrate portion beneath the epitaxial layers 208, 210, and in some cases a portion of the underlying substrate 202 itself. The fin cut process may include a dry etch (e.g., reactive ion etching), a wet etch, or a combination thereof. In some embodiments, the layer etch and fin cut processes of block 112 result in cavities 702 (previously including portions of the dielectric layer 502 and the spacer layer 402) and trenches 704 (previously including portions of the fins 204).

The method 100 then proceeds to block 114 where a dielectric layer is deposited, and an etch-back process is performed. With reference to FIGS. 8A, 8B, 8C, and 8D, in an embodiment of block 114, a dielectric layer 802 is deposited over the device 200, including within the cavities 702 and the trenches 704 (e.g., formed by the fin cut process of block 112). In some embodiments, the dielectric layer 802 is deposited using a CVD process, an SACVD process, a flowable CVD process, an ALD process, a PVD process, or other suitable process. After depositing the dielectric layer 802, an etch-back process may be performed to etch-back the dielectric layer 802. The etch-back process may include a dry etch (e.g., reactive ion etching), a wet etch, or a combination thereof. In some embodiments, the etch-back process results in a trench 804, as shown in FIG. 8B. In some embodiments, the etched-back dielectric layer 802 (e.g., FIG. 8B) may be referred to as a hybrid poly layer (or hybrid PO layer). In various examples, the hybrid poly layer (the etched-back dielectric layer 802) may include a HK material such as HfO2, ZrO2, HfAlOx, HfSiOx, Al2O3, or another high-K material (e.g., with a dielectric constant 'k'>7), a LK material including SiCN, SiOC, SiOCN, or another low-K material (e.g., with a dielectric constant 'k'<7), or a bi-layer dielectric material (e.g., where the upper part is HK, and the lower part is LK).

The method 100 then proceeds to block 116 where a dielectric layer is removed. With reference to FIGS. 9A, 9B, 9C, and 9D, in an embodiment of block 116, the dielectric layer 502 (deposited at block 108) is removed, leaving a portion of the hybrid poly layer (e.g., a portion of the etched-back dielectric layer 802) extending beyond a top surface of the adjacent fins 204 along the active edge (e.g., the boundary of the active regions 312 and 314). In some examples, the portion of the hybrid poly layer 802 extends beyond a top surface of the adjacent fins 204 about 40 nm. In some embodiments, the hybrid poly layer 802 thus provides electrical isolation between the adjacent active regions 312, 314. In embodiments where the dielectric layer 502 includes a SiN layer, block 116 includes removal of the SiN layer. Generally, removal of the dielectric layer 502 results in exposure of the underlying spacer layer 402 (e.g., in regions of the device 200 outside of the plane Y1-Y1' where the hybrid poly layer is disposed). In some examples, removing the dielectric layer 502 may also result in trenches 902 between adjacent fins 204 and hybrid fins 206 (FIG. 9C). Removal of the dielectric layer 502 may be performed using a dry etch (e.g., reactive ion etching), a wet etch, or a combination thereof.

The method 100 then proceeds to block 118 where a dummy layer is deposited. The dummy layer may be a conformal layer. With reference to FIGS. 10A, 10B, 10C, and 10D, in an embodiment of block 118, a dummy layer 1002 is conformally deposited over the device 200, including over the spacer layer 402 (exposed at block 116), over the hybrid poly layer (e.g., a portion of the etched-back dielectric layer 802), and within the trenches 902 (formed at block 116). The dummy layer 1002 may have a thickness of about 2-10 nm. In some examples, the dielectric layer 502 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the dummy layer 1002 may be formed by conformally depositing the dummy layer 1002 over the device 200 using processes such as a CVD process, a subatmospheric CVD (SACVD) process, a flowable CVD process, an ALD process, a PVD process, or other suitable process.

The method 100 then proceeds to block 120 where source/drain features are formed. With reference to FIGS. 11A, 11B, 11C, and 11D, in an embodiment of block 120, portions of the dummy layer 1002 and the spacer layer 402 may initially be etched-back to expose portions of the fins 204 not covered by the gate stacks 303, 305, 307 (e.g., for example, in source/drain regions), and including portions of the epitaxial layers 208 and 210. In some examples, the etch-back process may also etch portions of the second material 218 of the hybrid fins 206 not covered by the gate stacks 303, 305, 307. In some cases, the etch-back process removes portions of the dummy layer 1002 and the spacer layer 402 along a top surface of the gate stacks 303, 305, 307, thereby exposing the hard mask layer 310 of each of the gate stacks 303, 305, 307. In some embodiments, etching-back of the dummy layer 1002, the spacer layer 402, and the second material 218 may include a wet etch process, a dry etch process, a multiple-step etch process, and/or a combination thereof. It is noted that after the etch-back process, portions of the spacer layer 402 may remain disposed on sidewalls of the gate stacks 303, 305, 307. Also, in some cases and as a result of the etch-back process, a top portion of the hybrid poly layer 802 may be etched such that a portion of the hybrid poly layer 802 extends beyond a top surface of the adjacent fins 204 by about 20 nm.

In a further embodiment of block 120, source/drain features 1102, 1104 are formed in source/drain regions adjacent to and on either side of the gate stacks 303, 305, 307. In some embodiments, the source/drain features 1102, 1104 are formed by epitaxially growing a semiconductor material layer on the exposed fins 204 in the source/drain regions. In various embodiments, the semiconductor material layer grown to form the source/drain features 1102, 1104 may include Ge, Si, GaAs, AlGaAs, SiGe, GaAsP, SiP, or other suitable material. The source/drain features 1102, 1104 may be formed by one or more epitaxial (epi) processes. In some embodiments, the source/drain features 1102, 1104 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 1102, 1104 are not in-situ doped, and instead an implantation process is performed to dope the source/drain features 1102, 1104. In some embodiments, formation of the source/drain features 1102, 1104 may be performed in separate processing sequences for each of N-type and P-type source/drain features. As illustrated in FIGS. 11A and 11C, the hybrid fins 206 (e.g., portions of the first material 216 of the hybrid fins 206) may effectively prevent the undesirable lateral merging of the source/drain features 1102, 1104 formed on adjacent fins 204.

In some embodiments, and prior to formation of the source/drain features 1102, 1104, inner spacer layers may be formed 1210. Formation of the inner spacers 1210 may include a lateral etch of the epitaxial layers 210, followed by deposition and etch-back of a dielectric material to form the inner spacers 1210. In some embodiments, the inner spacers 1210 include amorphous silicon. The inner spacer layers 1210 extend beneath the sidewall spacers 402 while abutting the source/drain features 1102, 1104.

The method 100 then proceeds to block 122 where an inter-layer dielectric (ILD) layer is formed. Referring to the example of FIGS. 12A, 12B, and 12C, in an embodiment of block 122, an ILD layer 1202 is formed over the device 200. In some embodiments, a contact etch stop layer (CESL) 1204 is formed over the device 200 prior to forming the ILD layer 1202. In some examples, the CESL 1204 includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 1202 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1202 may be deposited by a PECVD process or other suitable deposition technique. In some embodiments, after formation of the ILD layer 1202, the device 200 may be subject to a high thermal budget process to anneal the ILD layer 1202.

In some examples, after depositing the ILD layer 1202 (and/or the CESL 1204 or other dielectric layers), a planarization process may be performed to expose a top surface of the gate stacks 303, 305, 307. For example, a planarization process includes a CMP process which removes portions of the ILD layer 1202 (and CESL layer, if present) overlying the gate stacks 303, 305, 307 and planarizes a top surface of the device 200. In addition, the CMP process may remove the hard mask layers 308, 310 overlying the gate stacks 303, 305, 307 to expose the underlying electrode layer 306, such as a polysilicon electrode layer, of the dummy gate.

The method 100 proceeds to block 124 where the dummy gate is removed. Referring to the example of FIGS. 11A-11D and FIGS. 12A, 12B, and 12C, in an embodiment of block 124, the exposed electrode layer 306 of the gate stacks 303, 305, 307 may initially be removed by suitable etching processes, followed by an etching process to etch the dielectric layer 304 and the HM layer 212 over the fins 204. In some examples, the etching processes may include a wet etch, a dry etch, or a combination thereof.

Thereafter, in some examples and in an embodiment of block 124, a selective removal of the epitaxial layer(s) in the channel region of the GAA device is performed. In some embodiments, the selected epitaxial layer(s) are removed from the fins 204 within a trench provided by the removal of the dummy gate electrode (e.g., the region of the fin on and over which the gate structure will be formed, or the channel region). Referring to the example of FIGS. 11A-11D and FIGS. 12A, 12B, and 12C, the epitaxial layers 210 are removed from the channel region of the exposed fins 204. In some embodiments, the epitaxial layers 210 are removed by a selective wet etching process. In some embodiments, the selective wet etching includes ammonia and/or ozone. As merely one example, the selective wet etching includes tetra-methyl ammonium hydroxide. (TMAH). In an embodiment, the epitaxial layers 210 are SiGe and the epitaxial layers 208 are silicon, allowing for the selective removal of the SiGe epitaxial layers 210. It is noted after selective removal of the epitaxial layers 210, gaps may be formed between the adjacent nanowires in the channel region (e.g., gaps between epitaxial layers 208).

The method 100 then proceeds to block 126 where a gate structure is formed. The gate structure may include a high-K/metal gate stack, however other compositions are possible. In some embodiments, the gate structure may form the gate associated with the multi-channels provided by the plurality of nanowires (epitaxial layers 208, now having gaps there between) in the channel region of the GAA device. With reference to the example of FIGS. 12A, 12B, and 12C, in an embodiment of block 126, a gate dielectric 1206 is formed within the trench of the GAA device provided by the removal of the dummy gate and/or release of nanowires, described above with reference to block 124. In various embodiments, the gate dielectric includes an interfacial layer (IL) and a high-K gate dielectric layer formed over the interfacial layer. In some embodiments, the gate dielectric 1206 has a thickness of about 1-5 nm. High-K gate dielectrics, as used and described herein, include dielectric materials having a high dielectric constant, for example, greater than that of thermal silicon oxide (~3.9).

In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-K gate dielectric layer may include a high-K dielectric layer such as hafnium oxide ($HfO_2$). Alternatively, the high-K gate dielectric layer may include other high-K dielectrics, such as $TiO_2$, HfZrO, $Ta_2O_3$, HfSiO4, $ZrO_2$, ZrSiO2, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

Still referring to the example of FIGS. 12A, 12B, and 12C, in a further embodiment of block 126, a metal gate including a metal layer 1208 is formed over the gate dielectric 1206 of the GAA device. The metal layer 1208 may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the device 200.

In some embodiments, the metal layer 1208 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 1208 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 1208 may be formed by ALD, PVD, CVD, e-beam evaporation, or other suitable process. Further, the metal layer 1208 may be formed separately for N-FET and P-FET transistors which may use different metal layers. In addition, the metal layer 1208 may provide an N-type or P-type work function, may serve as a transistor (e.g., GAA or FINFET device) gate electrode, and in at least some embodiments, the metal layer 1208 may include a polysilicon layer. With respect to the GAA device shown and discussed, the gate structure includes portions that interpose each of the epitaxial layers 208, which each form channels of the GAA device.

In some embodiments, the channel regions formed by the epitaxial layers 208, and which define nanosheets or nanowires, may have a variety of dimensions. For example, considering X and Y dimensions of the epitaxial layers 208 from an end-view of the epitaxial layers 208 (e.g., FIG. 10C), a nanowire X dimension (NW-X) may be equal to about 5-14 nm, and a nanowire Y dimension (NW-Y) may be equal to about 5-8 nm. In some cases, the nanowire X dimension (NW-X) is substantially the same as the nanowire Y dimension (NW-Y). By way of example, if the nanowire X dimension (NW-X) is greater than the nanowire Y dimension (NW-Y), then the nanowire structure may instead be referred to as a "nanosheet". In some cases, a spacing/gap between adjacent nanowires (epitaxial layers 208) is equal to about 4-8 nm.

The method 100 then proceeds to block 128 where contact features are formed. With reference to the example of FIGS. 12A, 12B, 12C, 13A, 13B, 13C, and 13D, in an embodiment of block 128, a portion of the metal layer 1208 may be etched-back and a metal layer 1212 is deposited over the etched-back metal layer 1208. In some embodiments, the metal layer 1212 includes selectively-grown tungsten (W), although other suitable metals may also be used. In at least some examples, the metal layer 1212 includes a fluorine-free W (FFW) layer. In various examples, the metal layer 1212 may serve as an etch-stop layer and may also provide reduced contact resistance (e.g., to the metal layer 1208). In some cases, a self-aligned contact layer 1302 may be formed over the metal layer 1212, where the self-aligned contact layer 1302 may include a dielectric material such as silicon oxide, silicon nitride, silicon carbide, silicon oxynitride, combinations thereof, or another suitable material. In various embodiments, source/drain contacts 1308 are formed to provide contact to the source/drain features 1102/1104, and vias 1310 may be formed to provide an electrical connection to the source/drain contacts 1308. In some embodiments, a metal contact etch stop layer (MCESL) 1304 and an ILD layer 1306 may also be formed.

Generally, the semiconductor device 200 may undergo further processing to form various features and regions known in the art. For example, subsequent processing may form contact openings, contact metal, as well as various contacts/vias/lines and multilayer interconnect features (e.g., metal layers and interlayer dielectrics) on the substrate 202 (e.g., some of which are shown in FIGS. 13A, 13B, 13C, and 13D and may be formed at block 128), configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100. Further, while the method 100 has been shown and described as including the device 200 having a GAA device, it will be understood that other device configurations are possible. In some embodiments, the method 100 may be used to fabricate FinFET devices or other multi-gate devices.

Figures 13A, 13B, 13C, 13D:
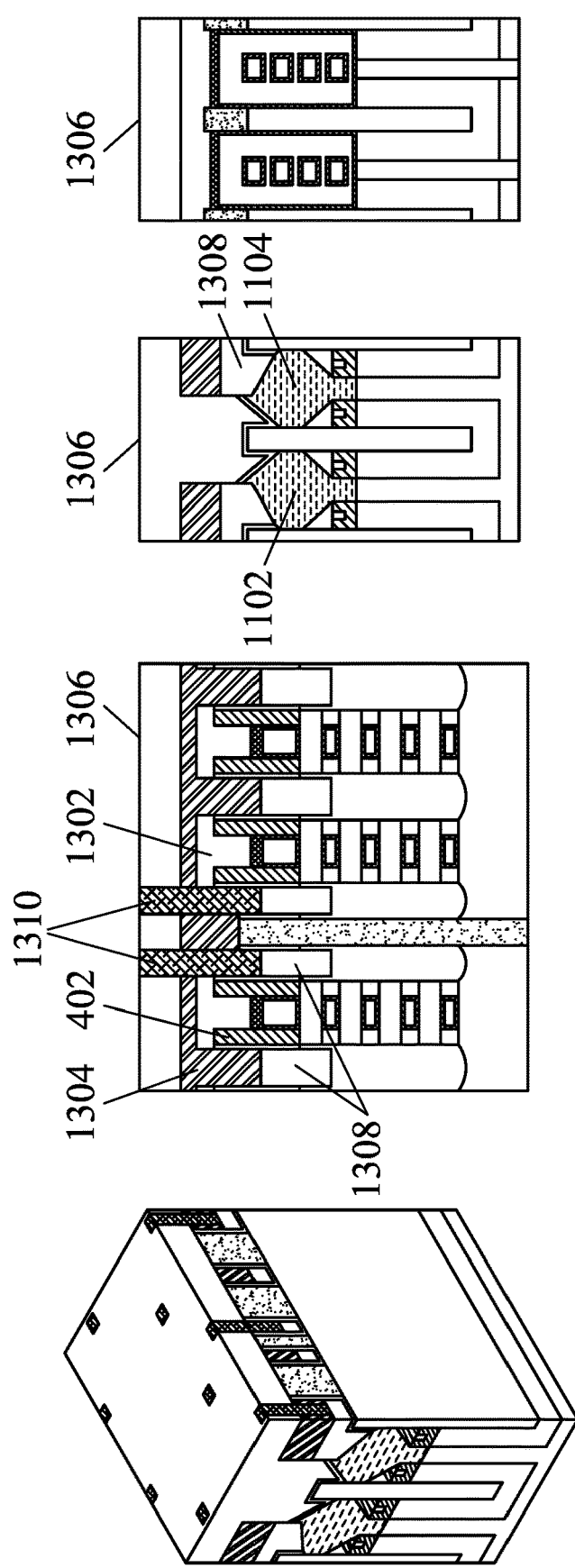
Figures 14A, 14B, 14C:
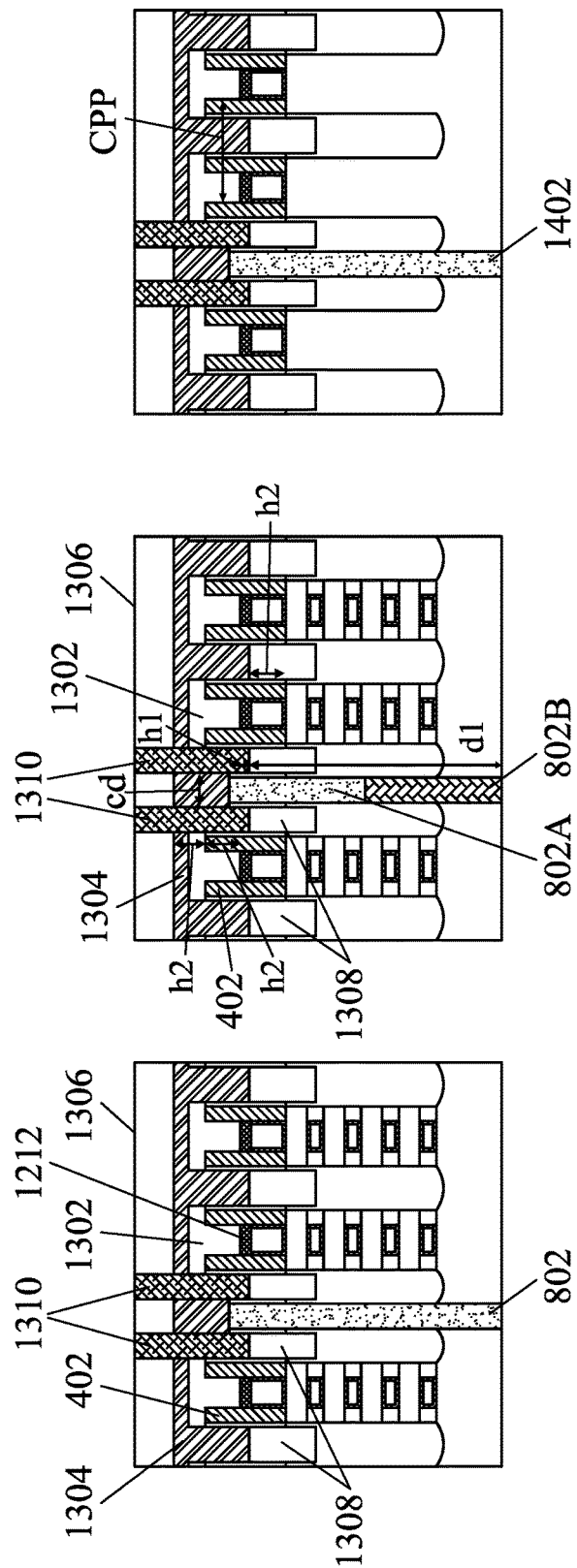
FIGS. 14A, 14B, and 14C are cross-sections of an embodiment of the semiconductor device 200 along the plane X-X', the plane X-X' being parallel to the channel of the device 200, of final device structures for devices fabricated in accordance with the method of FIG. 1.

Referring now to FIGS. 14A, 14B, and 14C, illustrated therein are cross-sections (e.g., along a plane similar to the plane X-X', discussed above) of final device structures for devices fabricated in accordance with the method 100. For example, FIG. 14A and FIG. 14B illustrate GAA devices, similar to the device 200 previously discussed. Thus, in some respects, the GAA devices of FIGS. 14A and 14B may be substantially similar to the device 200 as shown in FIG. 13B. However, in the examples of FIGS. 14A and 14B, the hybrid poly layer 802 may have different material compositions. In FIG. 14A, the hybrid poly layer 802 may include a HK material such as HfO2, ZrO2, HfAlOx, HfSiOx, Al2O3, or another high-K material (e.g., with a dielectric constant 'k'>7). In FIG. 14B, the hybrid poly layer may include a bi-layer dielectric material including a HK portion 802A and a LK portion 802B. The HK portion 802A may include a HK material as described above, and the LK portion 802B may include a LK material including SiCN, SiOC, SiOCN, or another low-K material (e.g., with a dielectric constant 'k'<7). FIG. 14C illustrates a FinFET device including a hybrid poly layer 1402, which may be formed in a manner substantially the same as described above with reference to the method 100. In various examples, the hybrid poly layer 1402 may include a HK material such as HfO2, ZrO2, HfAlOx, HfSiOx, Al2O3, or another high-K material (e.g., with a dielectric constant 'k'>7), a LK material including SiCN, SiOC, SiOCN, or another low-K material (e.g., with a dielectric constant 'k'<7), or a bi-layer dielectric material (e.g., where the upper part is HK, and the lower part is LK).

FIG. 14B also illustrates various exemplary dimensions for various features fabricated according to the method 100. For example, a hybrid poly height 'h1' (e.g., above a top surface of an adjacent fin structure) may be between about 10-30 nm, a hybrid poly CD 'cd' (e.g., hybrid poly width) may be about 6 nm, a hybrid poly depth 'd1' (e.g., below the top surface of the adjacent fin structure) may be between about 90-200 nm, and a hybrid PO HK/LK ratio (e.g., ratio of the HK portion 802A to the LK portion 802B) may be between about 1/20-20/1. FIG. 14B also illustrates a height 'h2', which may be between about 5-25 nm.

With respect to the description provided herein, disclosed are methods and structures including a hybrid poly (hybrid PO) scheme for the reduction of CPP. In various embodiments, the disclosed hybrid PO scheme may provide isolation (e.g., between neighboring active regions) by performing a cut fin process and filling the cut fin region at least partially with a high-K (HK) dielectric. Generally, the hybrid PO scheme also provides for aggressive cell abutment, resulting in about a 25% reduction in CPP compared to the CPODE scheme. Stated another way, the hybrid PO scheme may reduce CPP by 0.5 per cell compared to the CPODE scheme. In some examples, the hybrid PO scheme may be suitable for use with GAA devices (e.g., nanosheet/nanowire devices), FinFET devices, or other types of devices. In various examples, the hybrid PO scheme may utilize a variety of materials (e.g., to fill the cut fin region) such as (i) a high-K (HK) material including HfO2, ZrO2, HfAlOx, HfSiOx, Al2O3, or another high-K material (e.g., with a dielectric constant 'k'>7); (ii) a low-K (LK) material including SiCN, SiOC, SiOCN, or another low-K material (e.g., with a dielectric constant 'k'<7), or (iii) a bi-layer dielectric material (e.g., where the upper part is HK, and the lower part is LK). By employing the disclosed hybrid PO scheme, device density may be increased, cell isolation is improved, and device performance is enhanced. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a semiconductor device including a first transistor having a first gate structure and a first source/drain feature adjacent to the first gate structure. The semiconductor device further includes a second transistor having a second gate structure and a second source/drain feature adjacent to the second gate structure. In some examples, the semiconductor device further includes a hybrid poly layer disposed between the first transistor and the second transistor. The hybrid poly layer is adjacent to and in contact with each of the first source/drain feature and the second source/drain feature, and the hybrid poly layer provides isolation between the first transistor and the second transistor.

In another of the embodiments, discussed is a semiconductor device including a first fin element extending from a substrate having a fin cut region that separates the first fin element into a first fin portion and a second fin portion. The semiconductor device further includes a first gate structure disposed over the first fin portion and a second gate structure disposed over the second fin portion. In some embodiments, a first source/drain feature is disposed over the first fin portion adjacent to the first gate structure, where the first source/drain feature abuts a first side of the fin cut region. Further, in some cases, a second source/drain feature is disposed over the second fin portion adjacent to the second gate structure, where the second source/drain feature abuts a second side of the fin cut region opposite the first side. The semiconductor device further includes a first dielectric layer disposed within the fin cut region and in contact with each of the first and second source/drain features, where the first dielectric layer isolates the first fin portion from the second fin portion.

In yet another of the embodiments, discussed is a method of fabricating a semiconductor device that includes providing a substrate having a fin extending from the substrate. In some embodiments, the method further includes forming a first dummy gate structure over the fin within a first active region and forming a second dummy gate structure over the fin within a second active region adjacent to the first active region. An active edge is defined at a boundary between the first and second active regions. In some examples, the method further includes performing a fin cut process to form a fin cut region along a plane that includes the active edge. In some embodiments, the method further includes depositing a dielectric layer within the fin cut region, where the dielectric layer isolates the first active region from the second active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first transistor including a first gate structure and a first source/drain feature adjacent to the first gate structure;
a second transistor including a second gate structure and a second source/drain feature adjacent to the second gate structure, wherein the second gate structure is parallel to, and physically separated from, the first gate structure; and
a hybrid poly layer disposed between, and extending along a direction parallel to, the first gate structure and the second gate structure, wherein the hybrid poly layer is adjacent to and in contact with each of the first source/drain feature and the second source/drain feature, and wherein the hybrid poly layer provides isolation between the first transistor and the second transistor.

2. The semiconductor device of claim 1, wherein the first transistor and the second transistor include a multi-gate transistor.

3. The semiconductor device of claim 1, wherein the first transistor and the second transistor include a gate-all-around (GAA) transistor or a fin field-effect transistor (FinFET).

4. The semiconductor device of claim 1, wherein the first transistor is disposed in a first active region, wherein the second transistor is disposed in a second active region adjacent to the first active region, and wherein an active edge is defined at a boundary between the first and second active regions.

5. The semiconductor device of claim 4, wherein the hybrid poly layer is disposed along a plane that includes the active edge.

6. The semiconductor device of claim 1, wherein the hybrid poly layer includes a high-K (HK) material selected from a group including $HfO2$, $ZrO2$, $HfAlOx$, $HfSiOx$ and $Al2O3$.

7. The semiconductor device of claim 1, wherein the hybrid poly layer includes a low-K (LK) material selected from a group including SiCN, SiOC, and SiOCN.

8. The semiconductor device of claim 1, wherein the hybrid poly layer includes a bi-layer dielectric material, wherein an upper portion of the bi-layer dielectric material includes a high-K material, and wherein a lower portion of the bi-layer dielectric material includes a low-K material.

9. The semiconductor device of claim 8, wherein a ratio of the upper portion to the lower portion is between about 1/20-20/1.

10. The semiconductor device of claim 1, wherein a width of the hybrid poly layer is about 6 nm, wherein the hybrid poly layer extends above a top surface of an adjacent fin structure by about 10-30 nm, and wherein the hybrid poly layer has a depth below the top surface of the adjacent fin structure of between about 90-200 nm.

11. A semiconductor device, comprising:
a first fin element extending from a substrate including a fin cut region that separates the first fin element into a first fin portion and a second fin portion;
a first gate structure disposed over the first fin portion and a second gate structure disposed over the second fin portion;
a first source/drain feature disposed over the first fin portion adjacent to the first gate structure, wherein the first source/drain feature abuts a first side of the fin cut region;
a second source/drain feature disposed over the second fin portion adjacent to the second gate structure, wherein the second source/drain feature abuts a second side of the fin cut region opposite the first side; and
a first dielectric layer disposed within the fin cut region and in contact with each of the first and second source/drain features, wherein the first dielectric layer isolates the first fin portion from the second fin portion.

12. The semiconductor device of claim 11, wherein the first fin element includes a plurality of nanowires that define a plurality of channels of a gate-all-around (GAA) device.

13. The semiconductor device of claim 11, wherein the first fin element includes an epitaxial layer having a uniform composition, and wherein the epitaxial layer defines a channel of a fin field-effect transistor (FinFET).

14. The semiconductor device of claim 11, wherein the first dielectric layer includes a high-K (HK) material selected from a group including HfO2, ZrO2, HfAlOx, HfSiOx and Al2O3.

15. The semiconductor device of claim 11, wherein the first dielectric layer includes a low-K (LK) material selected from a group including SiCN, SiOC, and SiOCN.

16. The semiconductor device of claim 11, wherein the first dielectric layer includes a bi-layer dielectric material, wherein an upper portion of the bi-layer dielectric material includes a high-K material, and wherein a lower portion of the bi-layer dielectric material includes a low-K material.

17. The semiconductor device of claim 11, further comprising:
 a second fin element extending from the substrate, wherein the second fin element is parallel to the first fin element, wherein a third source/drain feature is disposed over the second fin element, and wherein the third source/drain feature is adjacent to the first source/drain feature; and
 a hybrid fin parallel to each of the first and second fin elements, wherein the hybrid fin interposes the first and second fin elements, and wherein the hybrid fin includes a second dielectric layer;
 wherein the second dielectric layer is configured to isolate the first source/drain feature from the third source/drain feature.

18. A semiconductor device, comprising:
 a first active region including a first source/drain feature;
 a second active region including a second source/drain feature, wherein the second active region abuts the first active region along an active edge; and
 a bi-layer dielectric material disposed at the active edge and electrically isolating the first source/drain feature from the second source/drain feature;
 wherein a first surface of the bi-layer dielectric material contacts the first source/drain feature within the first active region, and wherein a second surface of the bi-layer dielectric material contacts the second source/drain feature within the second active region; and
 wherein the bi-layer dielectric material includes an upper portion and a lower portion, wherein the upper portion includes a high-K material, and wherein the lower portion includes a low-K material.

19. The semiconductor device of claim 18, further comprising a first source/drain contact over the first source/drain feature and a second source/drain contact over the second source/drain feature, wherein the first source/drain contact is disposed within the first active region and adjacent to a first side of the high-K material, and wherein the second source/drain contact is disposed within the second active region and adjacent to a second side of the high-K material.

20. The semiconductor device of claim 18, wherein the high-K material is selected from a group including HfO2, ZrO2, HfAlOx, HfSiOx and Al2O3, and wherein the low-K material is selected from a group including SiCN, SiOC, and SiOCN.

* * * * *